United States Patent
Suzuki et al.

(10) Patent No.: US 11,256,422 B2
(45) Date of Patent: Feb. 22, 2022

(54) STORAGE SYSTEM AND COMPRESSED SENSOR DATA RECORDING METHOD FOR SENSORS GROUPED BASED ON PARAMETERS

(71) Applicant: HITACHI, LTD., Tokyo (JP)

(72) Inventors: Akifumi Suzuki, Tokyo (JP); Hiroaki Akutsu, Tokyo (JP); Takahiro Naruko, Tokyo (JP)

(73) Assignee: HITACHI, LTD., Tokyo (JP)

( * ) Notice: Subject to any disclaimer, the term of this patent is extended or adjusted under 35 U.S.C. 154(b) by 21 days.

(21) Appl. No.: 16/810,615

(22) Filed: Mar. 5, 2020

(65) Prior Publication Data
US 2020/0310655 A1 Oct. 1, 2020

(30) Foreign Application Priority Data
Mar. 29, 2019 (JP) .............................. JP2019-067988

(51) Int. Cl.
*G06F 3/06* (2006.01)
*G06F 11/30* (2006.01)
*G06N 3/04* (2006.01)

(52) U.S. Cl.
CPC ............ *G06F 3/0608* (2013.01); *G06F 3/067* (2013.01); *G06F 3/0653* (2013.01); *G06F 3/0659* (2013.01); *G06F 11/3089* (2013.01); *G06N 3/04* (2013.01)

(58) Field of Classification Search
CPC ............................ G06F 3/0608; G06F 11/3089
See application file for complete search history.

(56) References Cited

U.S. PATENT DOCUMENTS

| | | | |
|---|---|---|---|
| 2007/0174536 A1 | 7/2007 | Nakagawa et al. | |
| 2018/0018990 A1 | 1/2018 | Kim et al. | |
| 2020/0137420 A1* | 4/2020 | Natanzon | G06F 17/147 |
| 2020/0348662 A1* | 11/2020 | Cella | H04L 1/18 |

FOREIGN PATENT DOCUMENTS

JP 2007-199891 A 8/2007

OTHER PUBLICATIONS

Extended European Search Report for related EP App No. 20161353.6 dated Aug. 3, 2020, 13 pgs.
Abu Alsheikh, M., et al., Rate-Distortion Balanced Data Compression for Wireless Sensor Networks, Apr. 4, 2016, arXiv:1604.00736, 12 pgs.

(Continued)

*Primary Examiner* — David E Martinez
(74) *Attorney, Agent, or Firm* — Procopio, Cory, Hargreaves & Savitch LLP

(57) ABSTRACT

Provided is a storage system that can store various types of and large amounts of sensor data while accurately compressing the sensor data without wasting storage resources. The storage system includes: a storage that records sensor data output from a plurality of sensors; a processor that controls recording of sensor data in the storage; and a memory that records parameters of the plurality of sensors. The processor reads parameters assigned to the sensors that output the sensor data from the memory, normalizes the sensor data based on the parameters, compresses the normalized sensor data, and records the compressed sensor data in the storage.

10 Claims, 8 Drawing Sheets

(56) References Cited

OTHER PUBLICATIONS

Deb, S., How to Perform Data Compression Using Autoencoders?, Oct. 12, 2018, 15 pgs., [online] URL: https://medium.com/edureka/autoencoders-tutorial-cfdcebdefe37.
Gandhi, S., et al., GAMPS: Compressing Multi Sensor Data by Grouping and Amplitude Scaling, SIGMOD '09: Proceedings of the 2009 ACM SIGMOD International Conference on Management of Data, Jun. 2009, pp. 771-784.
Martinez, G., Autoencoders for the Compression of Stock Market Time Series, Jan. 18, 2019, 11 pgs., [online] URL: https://towardsdatascience.com/autoencoders-for-the-compression-of-stock-market-data-28e8c1a2da3e.

* cited by examiner

| | 611 | 612 | 613 | 614 | 615 | 616 | 617 |

| Sensor | Max | Min | Accuracy | Outlier Threshold | Comp Group | Side signal |
|---|---|---|---|---|---|---|
| A | 0.5 | -0.5 | ±0.001 | >0.3,<-0.3 | 1 | None |
| B | 10.0 | -10 | ±0.01 | ±0.8 | 1 | None |
| C | 10 | 0 | ±0.0001 | >100,<0 | 2 | Group1 |
| D | 1000 | -1000 | ±0.001 | >600, <-100 | 3 | None |
| E | 5000 | 0 | ±0.001 | >2000, <0 | 3 | None |
| : | : | : | : | : | : | : |

620

| | 621 | 622 | 623 |

| Comp Group | Comp Type | Comp option |
|---|---|---|
| 1 | Lossy A | |
| 2 | Lossy D | |
| 3 | Lossless D | |

STORAGE SYSTEM AND COMPRESSED SENSOR DATA RECORDING METHOD FOR SENSORS GROUPED BASED ON PARAMETERS

BACKGROUND OF THE INVENTION

1. Field of the Invention

The present invention relates to a storage system and, more specifically, to a storage system suitable for recording various types of and large amounts of sensor data output from a large number of sensors.

2. Description of the Related Art

IoT is introduced to various fields and applications in recent years. A system for IoT needs to be suitable for storing a large amount of time-series data output from a variety of sensors and analyzing the large amount of stored data. Therefore, a storage system effectively uses a limited storage resource while reducing a data size by compressing a large amount of sensor data (for example, JP-A-2007-199891 (Patent Literature 1) described below). As one of data compression methods, it is known that a character string having a high appearance frequency in a predetermined block unit is converted into a dictionary and replaced with a code having a smaller size, as in a run-length method.

In the first place, sensor data varies greatly in value range depending on the type of sensor, which is different from image data. Further, a value of the sensor data includes many disturbances and abnormal values and is originally unsuitable for existing compression methods. On the other hand, as the number of sensors increases with the expansion of IoT, the amount of sensor data increases dramatically, and storage resources having large volumes need to be allocated.

SUMMARY OF THE INVENTION

An object of the invention is to provide a storage system capable of storing various types of and large amounts of sensor data while accurately compressing the sensor data without wasting storage resources.

In order to achieve the above object, the invention provides a storage system including: a storage that records sensor data output from a plurality of sensors; a processor that controls recording of sensor data in the storage; and a memory that records parameters of the plurality of sensors. The processor groups the plurality of sensors based on parameters assigned to the sensors that output the sensor data and normalizes the sensor data for each group, collectively compresses the normalized sensor data in the group, and records the compressed sensor data in the storage.

Further, the invention provides a data recording method that records sensor data output from a plurality of sensors in a storage. A processor that controls recording of sensor data in the storage groups the plurality of sensors based on parameters assigned to the sensors that output the sensor data, and normalizes the sensor data for each group, collectively compresses the normalized sensor data in the group, and records the compressed sensor data in the storage.

According to the invention, it is possible to provide a storage system that can store various types of and large amounts of sensor data while accurately compressing the sensor data without wasting storage resources.

BRIEF DESCRIPTION OF THE DRAWINGS

FIG. 6 is an example of a normalization parameter table and a compression group management table;

DESCRIPTION OF THE PREFERRED EMBODIMENTS

Figure 1:
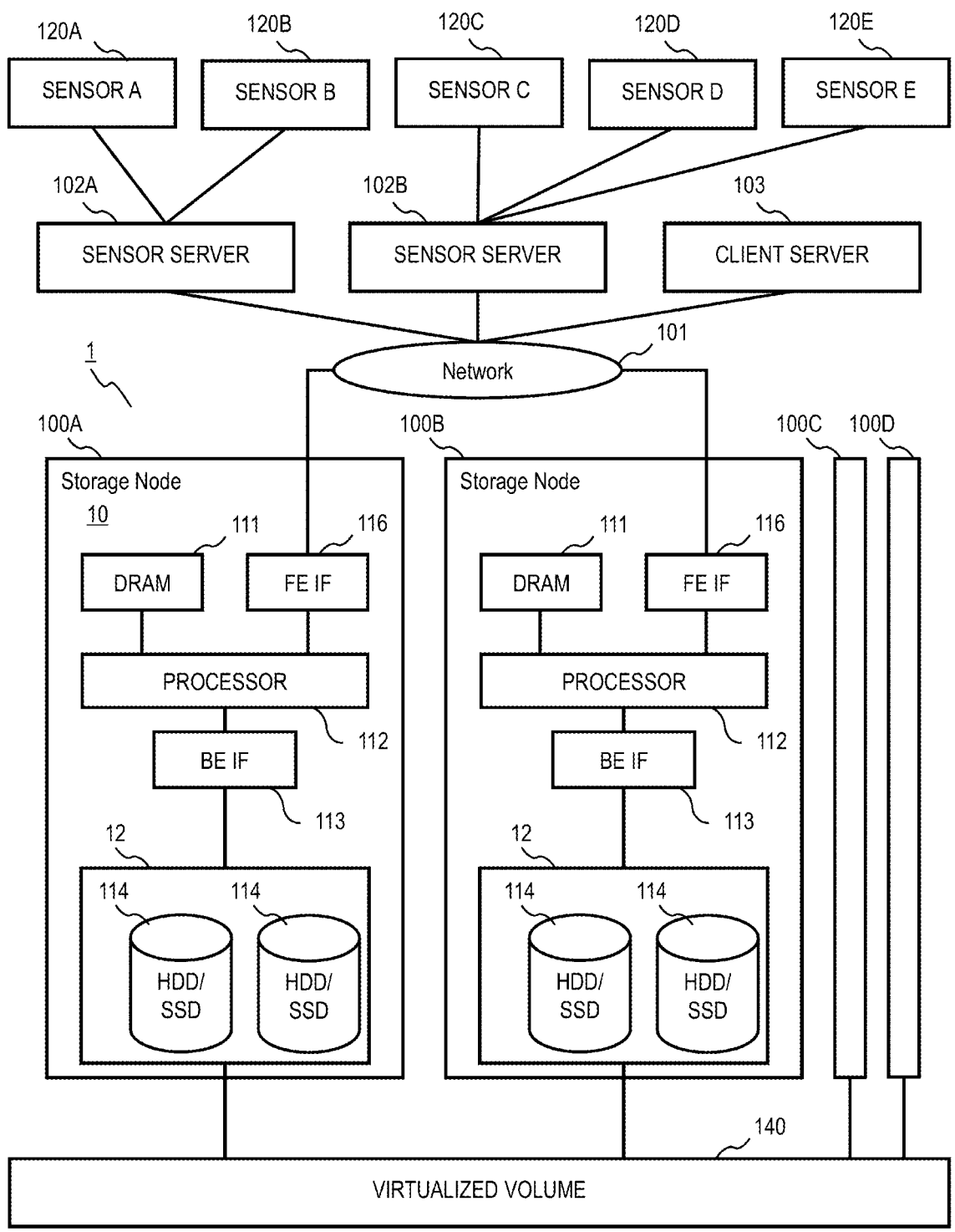
FIG. 1 is a block diagram of hardware of a computer system including a storage system.

An embodiment of the invention will be described with reference to the accompanying drawings. FIG. 1 is a block diagram of hardware of a computer system including a storage system. The computer system includes a storage system 1, a plurality of sensor servers 102A to 102B, and a client server 103. The above components are connected to each other by a network 101. The storage system 1 includes a plurality of storage nodes 100A to 100D. A sensor A and a sensor B are connected to the sensor server 102A, and a sensor C, a sensor D, and a sensor E are connected to the sensor server 102B. Sensors 120A to 120E may be of any type such as temperature sensors, humidity sensors, acceleration sensors, strain sensors, and image sensors.

The storage node 100A includes a storage controller 10 and a storage (storage resource) 12. The storage controller 10 includes a main memory (DRAM) 111 which is a primary storage area, a processor 112 that executes software, data compression and data decompression processing and stores data in the storage 12, a back-end interface (BE IF) 113 connected to the storage 12 serving as a secondary storage area, and a front-end interface (FE IF) 116 connected to the network 101. This also applies to the storage nodes 100B to 100D as well. The storage 12 includes an HDD and an SDD 114 as storage media.

The DRAM 111 is connected to the processor 112 such that the DRAM 111 can be accessed in a short time by the processor 112, and stores a program to be executed by the processor 112 and data. The processor 112 operates according to the program and processes the data. The processor 112 may have multiple cores and each core may be independent of or in coordination with other cores to process the program.

The processor 112 has a DRAM controller and the DRAM controller obtains data from the DRAM 111 or stores data to the DRAM 111. The processor 112 has an external I/O interface and is connected to the BE IF 113 via the external I/O interface. The processor 112 writes compressed data to the storage 12 and reads the compressed data via the BE IF 113. Various types of processing described below are performed by the processor 112.

The processor 112 compresses data and decompresses compressed data while executing storage-related software such as Software Defined Storage (SDS) and DataBase (DB). Physical storages 12 of the plurality of storage nodes 100A to 100D are integrated and virtualized as a logical volume 140. When the processor 12 writes compressed data in the logical volume, the compressed data is distributed and stored in each storage 12 of the plurality of storage nodes.

The BE IF 113 is an interface for communicating with a storage medium such as Serial ATA (SATA) or Serial Attached SCSI (SAS). At the time of write, the BE IF 113 acquires write target data from the DRAM 111 based on an instruction from the processor 112 and transfers the data to the storage 12. At the time of read, read target data is read from the storage 12 and transferred to the DRAM 111. The BE IF 113 may be an interface installed in the storage 12, for example, a Non-Volatile Memory Host Controller Interface (NVMe).

The FE IF 116 connects storage nodes 100 to the network 101. The sensor servers 102A and 102B manage sensors connected thereto and transfer sensor data output from the sensors to the aforementioned virtualized volume via the network 101.

The client server 103 causes a user to refer to sensor data stored in the storage nodes 100A to 100D. Upon receiving a request from the client server 103, the storage node decompresses compressed sensor data by the processor 112 and transfers the data to the client server 103.

With the evolution of IoT, a dramatic increase in sensor data is predicted. In order to store such a large amount of sensor data at a low cost, storage for lossy compression of data has been examined using an encoder built in a neural network.

As described above, sensor data is not suitable for a general-purpose compression method. However, artificial intelligence can learn characteristics, features, properties, attributes, or performance of sensor data, and thus any type of sensor data can be specialized in data characteristics to increase compression efficiency of the sensor data.

In order to create an encoder having a high compression rate, a neural network needs to learn data from a plurality of sensors collectively. However, since a value range of sensor data varies greatly depending on the sensors, when the neural network tries to learn data from the plurality of sensors, a sensor having a larger value range of sensor data preferentially holds the sensor data, and a sensor having a smaller value range of sensor data loses much information by lossy compression. A common measure to solve the problem of different value ranges of sensor data is to normalize the sensor data. That is, an average value, a variance value, a maximum value, a minimum value, and the like of the sensor data may be calculated and the sensor data may be normalized using the calculated values.

However, to obtain a parameter for normalization such as an average value or a variance value, a storage system need to include a buffer for holding a large amount of sensor data in an uncompressed state, and a compression rate of data in the storage system is greatly reduced.

Therefore, the storage system may create in advance management information (a database) having parameters for normalizing sensor data and normalize sensor data by referring to the parameters of the database when compressing the sensor data, so that a large amount of sensor data may not be stored before the sensor data is compressed.

Figure 2:
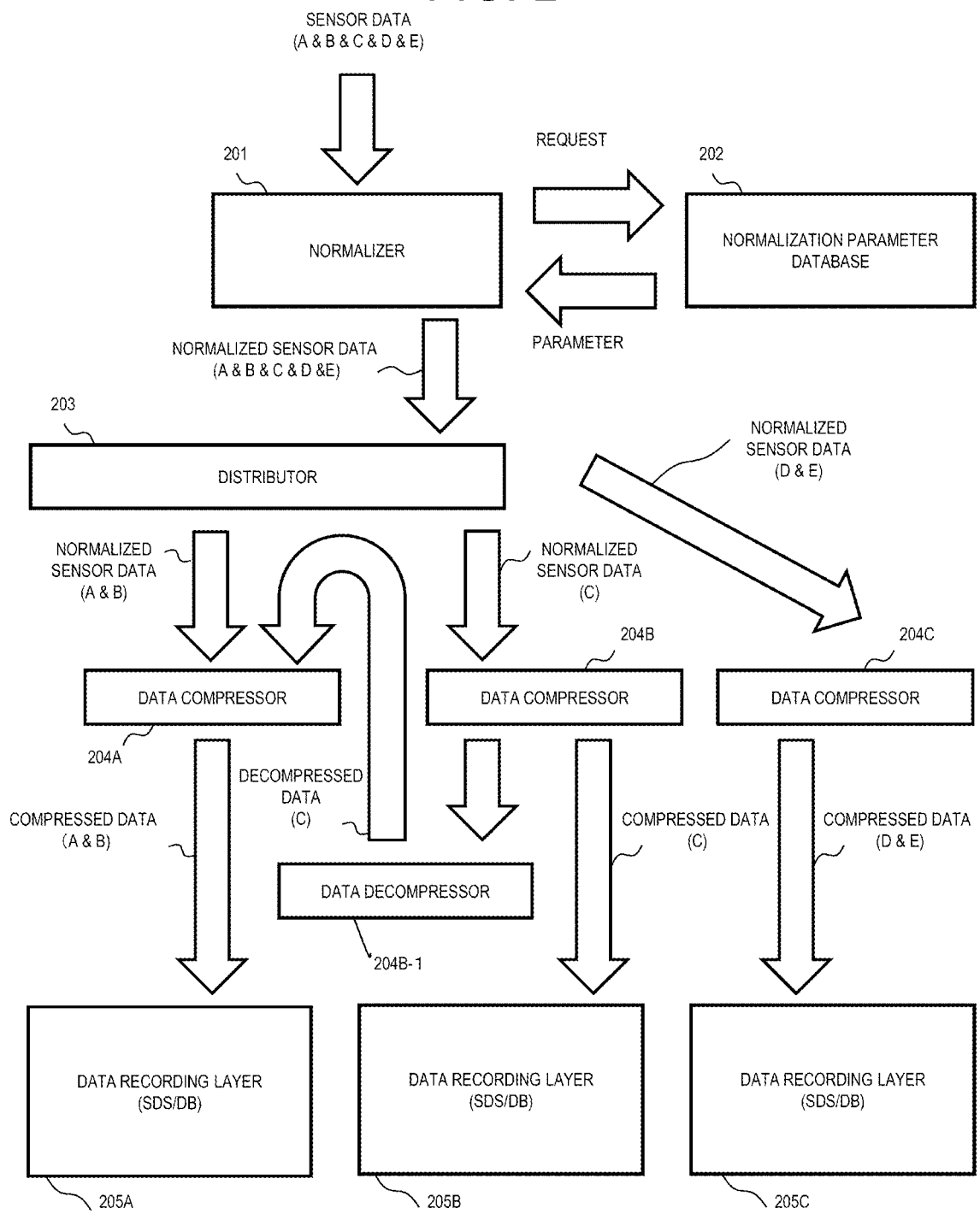
FIG. 2 is a functional block diagram for a storage node to compress sensor data.

Next, compression processing of sensor data of the storage nodes 100A to 100D will be described. FIG. 2 is a functional block diagram thereof. The compression processing is achieved by a normalizer 201, a normalization parameter DB 202, a distributor 203, data compressors 204A to 204C, and data recording layers 205A to 205C. The processor 112 of a storage node implements the normalizer 201, the distributor 203, and the data compressors 204A to 204C by executing the program. These elements may be rephrased as "unit", "function", "part", and the like. Furthermore, these elements may be implemented by hardware or by cooperation of hardware and software. When sensor data is transferred from the sensor server 102 via the network 101, the processor 112 normalizes the sensor data and compresses the sensor data.

A time series of the sensor data is continuously input from the sensor server 102 to the normalizer 201. The normalizer 201 requests parameters for normalization to the normalization parameter DB 202 at a timing when the sensor data is received, and acquires parameters corresponding to the sensor data from the DB 202. The normalizer 201 normalizes the sensor data based on the normalization parameters. The normalization causes values of the sensor data to fall within a certain range, for example, 0 to 1, thereby executing following operation.

$$\text{Normalized value} = (\text{Value of sensor data before normalization} - \text{Normalization parameter(a minimum value)}) \div (\text{Normalization parameter(a maximum value)} - \text{Normalization parameter(a minimum value)})$$

This is an example and is called a Max-Min method. Normalization may be performed by a method called z-score, in which an average value and a variance value of values for each sensor are calculated and normalized sensor data is defined by "(sensor data−average value)/variance value".

The sensor data may include an abnormal value due to an abnormality of the sensor, a failure of a communication path, or the like. The abnormal value causes learning of the neural network to fail. Therefore, the normalizer 201 eliminates the abnormal value from the sensor data. The normalizer 201 compares the sensor data with sensor data at previous and subsequent timings and determines that sensor data having an extremely small or large value is abnormal.

Alternatively, the normalizer 201 may refer to a threshold as a reference of the abnormal value from the normalization parameter DB 202 to determine an abnormal value of the sensor data. The normalizer 201 may replace the sensor data determined as the abnormal value with an average value of values of sensor data at previous and subsequent timings (points).

Alternatively, the sensor data having the abnormal value may be used as a data value at a previous timing. Information of the normalization parameter DB 202 may be distributed to the plurality of storage nodes 100A to 100D and stored in each storage medium 114. The processor 112 of each of the plurality of storage nodes reads parameters corresponding to the sensor based on the information for managing the distribution.

When the normalizer 201 normalizes the sensor data, the sensor data is transmitted to the distributor 203 as normalized sensor data. The distributor 203 distributes the normalized sensor data to any one of the plurality of data compressors 204A to 204C based on information included in the normalization parameters. In FIG. 2, normalized sensor data A and B are transmitted to the data compressor 204A, normalized sensor data C is transmitted to the data compressor 204B, and normalized sensor data D and E are transmitted to the data compressor 204C.

A plurality of data compressors are provided for the following reason. In order to compress sensor data by the neural network at a high compression rate, it is preferable to compress the sensor data of a plurality of sensors while learning the sensor data collectively. That is, a data amount is further reduced by collectively compressing data of a plurality of sensors having similar output value change tendencies.

For example, assuming sensor data of the sensor A changes as 1, 2, 2, 4 and sensor data of the sensor B changes as 3, 6, 6, 12, when the two pieces of sensor data are collected, compressed data of 2, 4, 4, 8 is output from the compressor. Then, when the processor 112 constructs a decompressor that reproduces the sensor data of the sensor A as ½ of the compressed data and the sensor data of the sensor B as 3/2 of the compressed data, the two pieces of sensor data can be restored and the data amount can be reduced by simply recording one series of compressed data and decompressor parameters in the storage. In this way, in order to enhance the compression effect, a data series of a plurality of sensors may be input to the compressor at the same time.

However, when sensor data of a plurality of sensors having different characteristics are collectively compressed, data compression may not be performed accurately. For example, when sensor data of a temperature sensor as a sensor that requires accuracy and sensor data of a humidity sensor as a sensor that does not require accuracy are collected and the neural network performs lossy compression, regardless of whether or not the sensor is highly accurate, information is lost on average, and sensor data of a sensor having high accuracy cannot be stored prior to sensor data of a sensor having low accuracy.

Therefore, the storage system classifies the sensors into groups on the same or a similar characteristic basis and performs data compression on a group basis based on characteristics of the sensors or characteristics of the sensor data. The sensors A and B are sensors having similar characteristics, and the same applies to the sensors D and E. The sensor C is a sensor having characteristics different from other sensors.

The data compressor 204A compresses the normalized sensor data A and B and records the compressed sensor data A and B in the data recording layer 205A. The data compressor 204B compresses the normalized sensor data C and records the compressed sensor data C in the data recording layer 205B. The data compressor 204C compresses the normalized sensor data D and E and records the compressed sensor data D and E in the data recording layer 205C.

When there is a dependency or correlation between sensor data of the plurality of sensors, for example, temperature and humidity are mutually dependent, by compressing sensor data of one sensor using sensor data of other sensor, a compression rate of the sensor data of the one sensor can be improved. The compressor does not compress temperature data and humidity data collectively but can improve the compression rate of the humidity data by using the temperature data as supplementary information when the compressor lossy-compresses the humidity data. The use of other data for compression of certain data is referred to as a side signal. The side signal is not limited to one piece of sensor data but may be a plurality of sensor data.

The data compressor 204B compresses the normalized sensor data C, which is then decompressed by a data decompressor 204B-1 and sent to the data compressor 204A. The data compressor 204A compresses the normalized sensor data A and B utilizing the normalized compressed-then-decompressed sensor data C (a side signal). In this way, when there is a dependency between a plurality of pieces of data and one piece of data is used to compress other data, the plurality of compressors adjust the order of compressing the data and execute data compression.

When the processor 112 compresses certain data, when a side signal exists in the data, the processor 112 performs compression of the side signal first. A reason why the compressor 204A compresses data after the compressed sensor data C is decompressed is that decompressed data of the compressed sensor data C is used when decompressing the compressed sensor data A and B. The processor 112 may compress the sensor data D and E regardless of the order of compressing the sensor data A and B and the sensor data C.

The data recording layers 205A to 205C hold the compressed data by distributing the compressed data to the plurality of storage nodes 100A to 100D and are constituted by distributed storage software (for example, Ceph). The data recording layers 205A to 205C make data redundant and distribute the data in a plurality of storage nodes for data protection.

Figure 3:
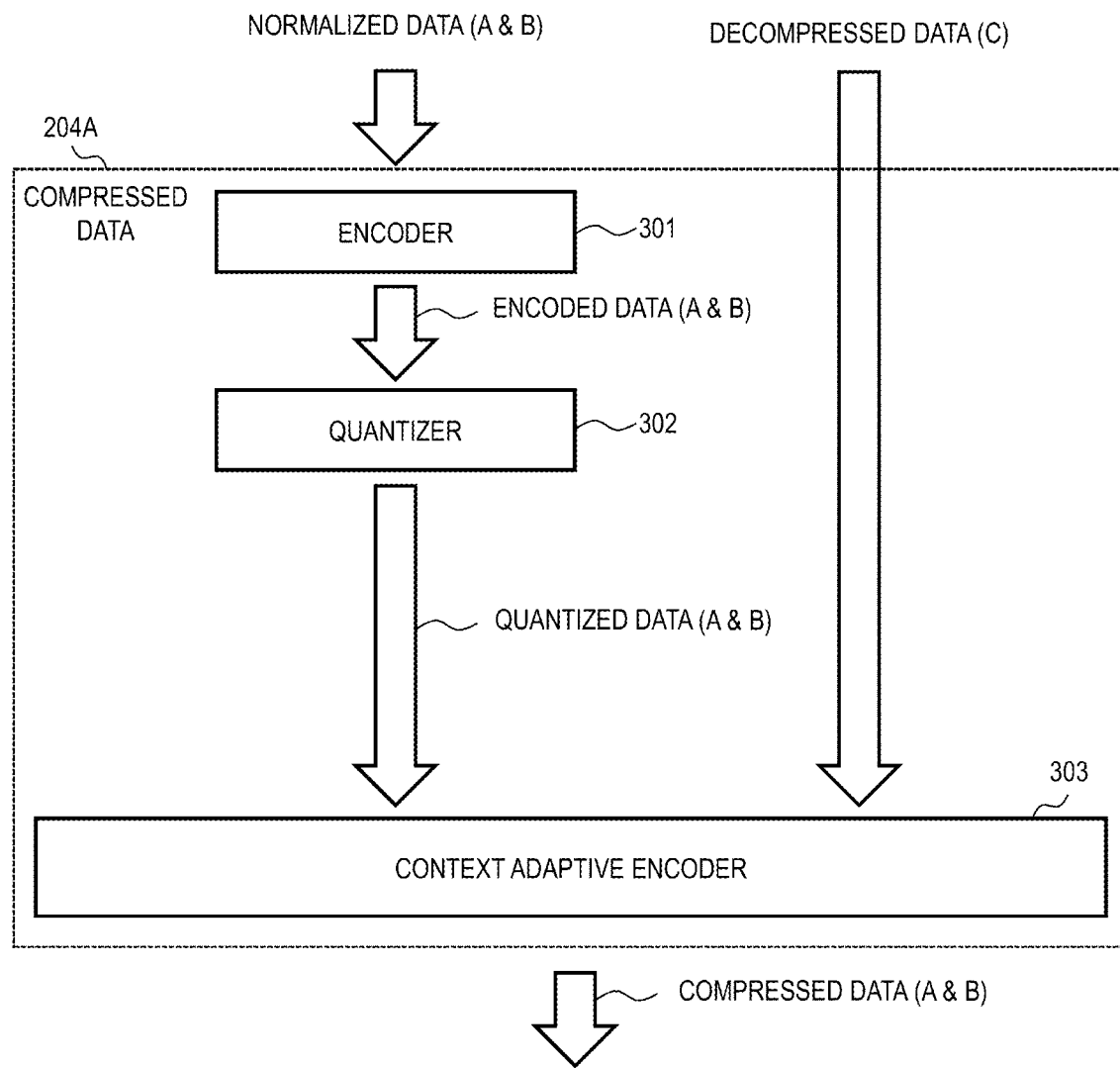
FIG. 3 is a functional block diagram for illustrating details of a data compressor.

Next, a detailed functional block of a data compressor will be described with reference to FIG. 3 by taking the data compressor 204A as an example. The data compressor 204A includes an encoder 301, a quantizer 302, and a context adaptive encoder 303. The encoder 301 receives and converts the normalized sensor data A and B from the distributor 203. The encoder 301 refers to a plurality of pieces of sensor data, collects similar redundant data, performs conversion processing such as removing high-frequency data, and converts the data into a format having a smaller data amount. The encoder 301 includes a neural network.

The quantizer 302 quantizes the encoded data that is an output of the encoder 301. The processing converts, for example, an output value of the encoder 301 which is a real value in float 32 format into a real value symbol in float 16 format or an integer symbol in int8 format. In addition, processing of determining a real value unique for the symbol, for example, SymbolA: 31.4 and SymbolB: −4.5, and replacing the encoded real value with a closest real value may be used, in which 35.1 is set to SymbolA, and 2.0 is set to SymbolB. Although information of the values by the quantizer is inaccurate, it is possible to significantly reduce the data amount. The quantizer 302 is disabled when the type of compression of the sensor data is lossless.

The context adaptive encoder 303 analyzes quantized sensor data which is an output value of the quantizer 302, the a timing at which sensor data is output from the sensor may be referred to as a point, but occurrence probability of a symbol for each point is predicted. When side signals are set in a plurality of sensor data groups (compression groups) compressed by the same compressor in a normalization parameter table 610 (FIG. 6: normalization parameter DB), the occurrence probability of the symbol is predicted with higher accuracy using the side signals. Prediction of occurrence probability of a symbol based on side signals will be described in detail below.

It is assumed that sensor data having a symbol string "A, B, A, B, A, A, B" is output from the quantizer 302. According to a compression method considering a context (for example, Context-based Adaptive Binary Arithmetic Coding (CABAC)), it is determined that B has a high probability of appearing next to A, and when A appears, the next becomes B with a probability of ¾ and becomes A with a probability of ¼. In this method, symbol occurrence probability is also obtained using symbols at a point other than the previous symbol one point before, and compression is performed.

The context adaptive encoder 303 further uses side signals to predict the symbol occurrence probability for each point. For example, when a side signal used to compress the symbol string "A, B, A, B, A, A, B" is a symbol string "C, C, C, C, C, D, C", when a previous point is a symbol A and the symbol of the side signal at the same point is C, the probability of becoming B is 100%.

Similarly, when the previous point is the symbol A and the symbol of the side signal at the same point is D, the probability of becoming A is 100%. By using an appropriate side signal in this way, the symbol occurrence probability for each point can be predicted with higher accuracy. After predicting the symbol occurrence probability, the context adaptive encoder 302 arithmetically compresses the quantized sensor data using the occurrence probability. For a compressed group in which no side signal is registered, the context adaptive encoder 303 predicts the symbol occurrence probability for each point using only the quantized data.

Figure 4:
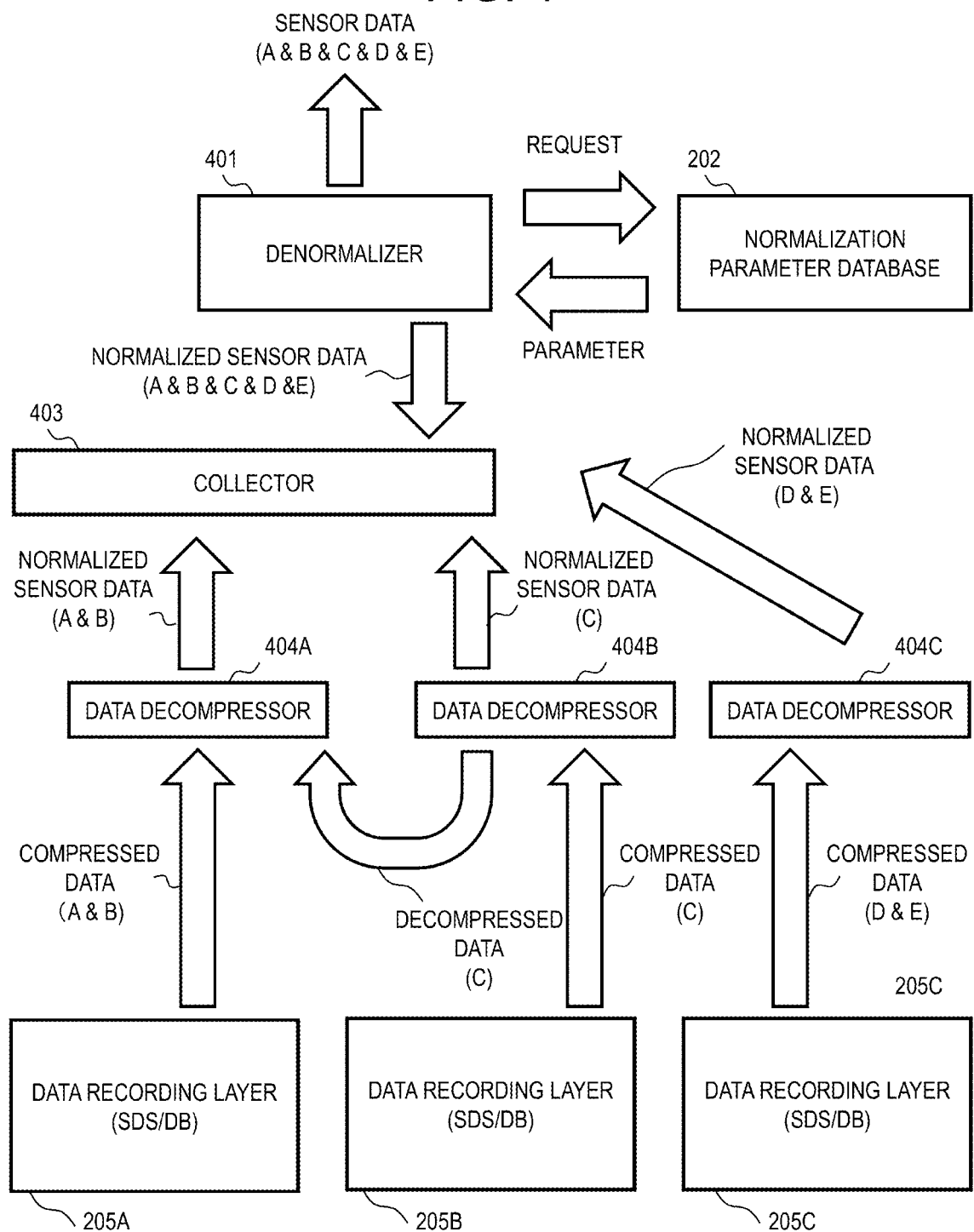
FIG. 4 is a functional block diagram for illustrating decompression processing of compressed data in the storage system.

Next, decompression processing of compressed data in a storage system will be described. FIG. 4 shows a functional block diagram thereof. The decompression processing performed by the processor 112 is implemented by a denormalizer 401, the normalization parameter DB 202, a collector 403, data decompressors 404A to 404C, and the data recording layers 205A to 205C.

When the processor 112 receives a request to acquire sensor data from the client server 103, the processor 112 starts data decompression. The denormalizer 401 requests normalization parameters of a sensor requested from the client server 103 to the normalization parameter database 202, acquires the normalization parameters, and notifies the collector 403 of information thereof.

The processor 112 reads compressed sensor data A and B from the data recording layer 205A and causes the data decompressor 404A to decompress the compressed data. The processor 112 reads compressed sensor data C from the data recording layer 205B and causes the data decompressor 404B to decompress the compressed data.

Then, the processor 112 reads compressed sensor data D and E from the data recording layer 205C and causes the data decompressor 404C to decompress the compressed data. The collector 403 collects the normalized sensor data A and B from the data decompressor 404A, collects the normalized sensor data C from the data decompressor 404B, collects the normalized sensor data D and E from the data decompressor 404C, and collects the above data and outputs the data to the denormalizer 401.

The processor 112 determines the order of the decompression processing of the compressed data based on the normalization parameters. That is, when a side signal exists in a requested sensor, sensor data of the side signal is first decompressed. The processor 112 decompresses the compressed data of the sensor C before decompressing the compressed data of the sensors A and B, and uses the decompressed data to decompress the compressed data of the sensors A and B.

The processor 112 may decompress the compressed data of the sensor data C at any timing regardless of the order. Each of the plurality of data recording layers 205A to 205C collects and combines specific sensor compressed data that is distributed and stored in a plurality of storage nodes, and passes the data to any of the corresponding data decompressor 404A to 404C.

The denormalizer 401 returns normalized T sensor data received from the collector 403 to an original range using the normalization parameters. This is achieved by applying next calculation processing to data normalized to 0 to 1.

Sensor data value after denormalization=Sensor data value after normalization×(maximum value of normalization parameters−minimum value of normalization parameters)+minimum value of normalization parameters The denormalizer 401 provides the client server 103 with sensor data whose value range is returned to before-normalization by denormalization processing.

Figure 5:
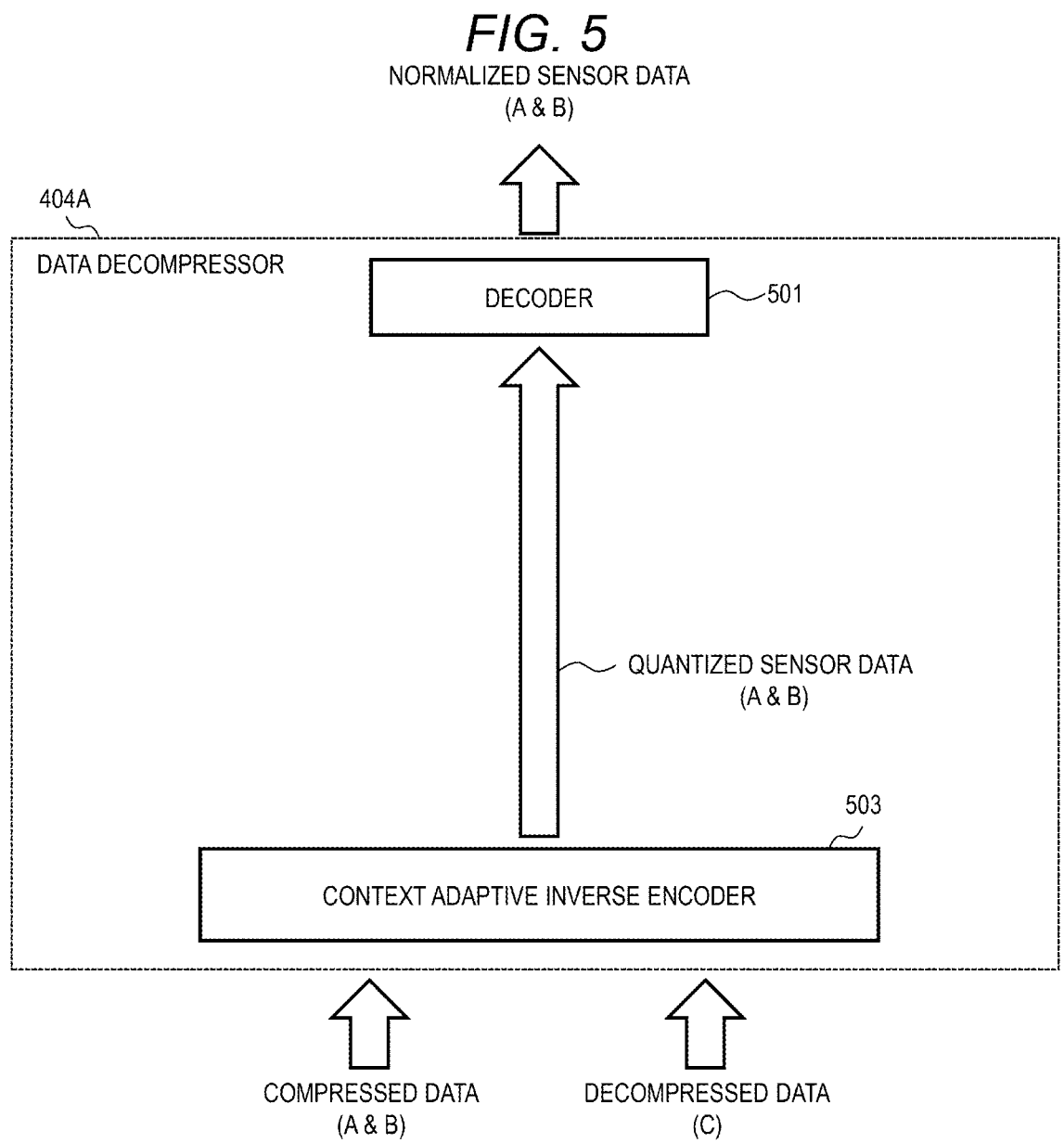
FIG. 5 is a functional block diagram for illustrating details of a data decompressor.

Next, details of the data decompressor 404A will be described with reference to a block diagram of FIG. 5. The data decompressor 404A includes a decoder 501 and a context adaptive inverse encoder 503. The same applies to other data decompressors.

The data decompressor 404A requires data of the sensor C which is a side signal when decompressing data of the sensor A and the sensor B that are lossy-compressed. The data of the sensor C is data that is decompressed after being lossy-compressed and a part of the data is lost due to the lossy compression, but is the same as the normalized data. Thus, the data decompressor 404B decompresses the compressed data of the sensor C first before the data decompressor 404A decompresses the compressed data.

The context adaptive inverse encoder 503 decompresses arithmetically compressed data using the compressed data of the sensor A and the sensor B and the decompressed data of the sensor C. The context adaptive inverse encoder 503 calculates the occurrence probability of a symbol at a certain point using the compressed data of the sensor A and the sensor B and the data of the sensor C which are decompressed before the point, and decompresses a symbol value using the occurrence probability. The encoder 503 decompresses all data of the compressed data of the sensor A and the sensor B by repeating the above operation. The context adaptive inverse encoder 503 transfers the decompressed data to the decoder 501.

The decoder 501 converts decompressed data into a format close to normalized sensor data and transfers the converted data to the collector 403. The decoder 501 is constituted by a neural network. Since a side signal is not set in the sensor data of the sensor C, the data decompressor 404B decompresses only the compressed data of the sensor C, and the data decompressor 404C also decompresses the compressed data of the sensor D and the compressed data of the sensor E without using the side signal.

Next, the normalization parameter database 202 will be described. The normalization parameter database 202 manages normalization parameters and compression groups. As described above, sensors having similar characteristics are grouped together as a group based on the sensor characteristics, and the storage system performs compression for each group. This group is referred to as a compression group. As shown in FIG. 6, the normalization parameter database 202 includes a normalization parameter table 610 and a compression group management table 620. The normalization parameter table 610 includes a sensor name 611, normalization parameters 612 to 615 set for a sensor, and corresponding information 616 to 617 of a compression group for the sensor. The normalization here uses the MAX-MIN method. The normalization parameter table 610 includes fields of the sensor name 611, the MAX value 612, the MIN value 613, the sensor accuracy 614, the abnormal value determination threshold 615, the compression group 616, and the side signal 617.

The sensor name 611 is a field of storing a name of a sensor as a character string. The normalizer 201 can acquire normalization parameters based on the sensor name sent from the client server 103. The sensor name may be set by the user.

The MAX value 612 is a maximum measurable value of a sensor specified by the sensor name 611, and the MIN value 613 is a minimum value thereof. These parameters vary depending on types and specifications of sensors. The MAX value and the MIN value are used for the normalizer 201 to normalize sensor data and for the denormalizer 401 to denormalize decompressed data. Denormalization refers to returning normalized data to a state before normalization. These values may be set by the user.

The sensor accuracy 614 is measurement accuracy of a sensor specified by the sensor name 611. The sensor accuracy 614 may be set by the user.

The abnormal value determination threshold 615 is a threshold for identifying an abnormal value among measurement data of the sensor specified by the sensor name 611. The normalizer 201 may delete data outside a threshold or replace it with data within the threshold based on the threshold. The threshold may be input by the user. Alternatively, the sensor servers 101A to 101C or the storage nodes 100A to 100D may calculate the threshold based on sensor data. For example, an average value and a variance of sensor data may be calculated, and average value±(variance×3) may be used as a threshold.

The compression group 616 is identification information of a compression group to which a sensor specified by the sensor name 611 belongs. The encoder 301 constituted by a neural network collectively encodes sensor data of a plurality of sensors having a plurality of characteristics, and converts the sensor data into an efficient format having a small data amount to perform compression. The more similar the characteristics of the sensor or sensor data, the more the encoder 301 can convert the sensor data into an efficient format. Since such conversion cannot be performed between a plurality of sensors whose characteristics are not similar to each other, the plurality of sensors may be compressed separately by a plurality of compressors and then decompressed by a plurality of decompressors.

That is, since loss of information by lossy compression of data of sensors belonging to the same compression group occurs similarly to sensors belonging to the compression group, for example, regarding accuracy as an example of sensor characteristics, when a sensor having high accuracy and a sensor having low accuracy belong to the same group, the amount of information loss due to lossy compression is large for the data of the sensor having high accuracy. Accordingly, it is preferable to classify the sensor with high accuracy and the sensor with low accuracy into different compression groups. The processor 112 uses the compression group 616 to manage compression and decompression of sensor data. The compression group 616 may be set by the user, or may be determined or set by the processor 112 of a storage node.

The side signal 617 is a number of a compression group to which a sensor specified by the sensor name 611 is applied as a side signal. As described above, the side signal is other sensor data used to improve the compression rate of sensor data belonging to a compression group. A set value of the side signal 617 is input by the user before storing sensor data in a storage node, or is automatically set by automatic determination of a side signal described below processed by the storage node. The side signal 617 may be set by the user or may be set by the processor 112 of the storage node.

The normalization parameter database 202 includes the compression group management table 620. The compression group management table 620 manages a compression method for each compression group. The distributor 203 refers to the compression method for each compression group via the normalizer 201 and notifies the data compressors 204A to 204C of this. The compression group management table 620 includes a compression group 621, a compression type 622, and a compression option 623. The compression group 621 corresponds to the compression group 616 of the normalization parameter table 610.

The compression type 622 is a field of storing a compression option for a compression group specified by the compression group number 621. In this field, a suitable compression method may be set from a plurality of algorithms for lossless compression and a plurality of algorithms for lossy compression. The compression type 622 may be set by the user or by a storage node. Lossy A and Lossy D are examples of lossy compression. Lossless D is an example of lossless compression.

The compression option 623 is a field of specifying an option for compression for the compression group specified by the compression group number 621. This includes, for example, quantization granularity of the quantizer 302. Information is registered in the normalization parameter table 610 and the compression group management table 620 before data compression.

Next, an example in which the storage system determines a compression group will be described based on a flowchart shown in FIG. 7. Automatic classification may be achieved based on K-means clustering, for example. The storage system may receive a part of a large amount of sensor data from a sensor server as test data and determine a compression group based on the test data. The storage system determines accuracy of the sensors and groups the sensors. The storage system executes the flowchart of FIG. 7 for each of the plurality of sensors.

The processor 112 acquires normalization parameters of each of a plurality of sensors from the normalization parameter table 610, and obtains the number of measurement steps (S701).

The number of measurement steps is a value obtained by dividing a measurement range (MAX to MIN: 612, 613) of a sensor by the sensor accuracy 614. For example, a sensor having accuracy of ±0.001 in a range from −1 to +1 has 2000 measurement steps, and a sensor having accuracy of ±0.001 in a range from −10 to +10 has 20000 measurement steps. A sensor having a larger number of measurement steps has more sensor data steps, and there is a reason for storing the sensor data with high accuracy.

In a group to which a sensor having a large number of measurement steps belongs, the sensor data is lossy-compressed at a low compression rate due to reduced quantization accuracy of the quantizer 302, and a data reduction rate due to compression of the data having a small information loss is reduced. On the other hand, in a group to which a sensor having a small number of measurement steps belongs, the sensor data is lossy-compressed at a high compression rate and a data reduction rate due to compression of data having a large information loss is increased.

Subsequently, the processor 112 divides the number of measurement steps by a reference value to create a measurement step group (S702). For example, when the reference value is 100, 1000, sensors having a number of measurement steps of 50 and a reference value up to 100 are classified into a measurement step group 1, and sensors having a number of measurement steps of 340 and a reference value up to 1000 are classified into a measurement step group 2, and sensors having a number of measurement steps of 2000 and a reference value exceeding 1000 are classified into a measurement step group 3.

Subsequently, for each measurement step group, the processor 112 calculates a correlation coefficient between a plurality of sensors belonging to the same measurement step group based on sensor data of the sensors (S703). It can be said that sensor data of two sensors tend to have similar characteristics as an absolute value of the correlation coefficient increases.

Next, the processor 112 classifies the plurality of sensors into a compression group based on the correlation coefficient (S704). The processor 112 classifies one or a plurality of sensors having an absolute value of the correlation coefficient larger than 0.4, for example, into the same compression group. Accordingly, sensors having the close numbers of measurement steps and similar tendencies are collected in the same compression group. When sensors having a correlation coefficient equal to or greater than a threshold exist in a plurality of compression groups, the sensor having the largest correlation coefficient may belong to the compression group to which the sensor belongs. One compression group includes at least one sensor.

Next, the processor 112 registers the compression group in the normalization parameter table 610 (S705).

Next, an example in which the storage system determines a side signal will be described based on a flowchart shown in FIG. 8. Although the flowchart cannot classify sensors having different numbers of measurement steps into the same compression group, the storage system uses one sensor as a side signal of another sensor and compresses sensor data of the other sensor using sensor data of the one sensor for sensors that are dependent on each other. For example, since a temperature sensor and a humidity sensor are different in accuracy, the two sensors cannot be classified into the same group. However, since the temperature and the humidity are dependent and correlated, one sensor may be set as a side signal of the other sensor.

Figure 7:
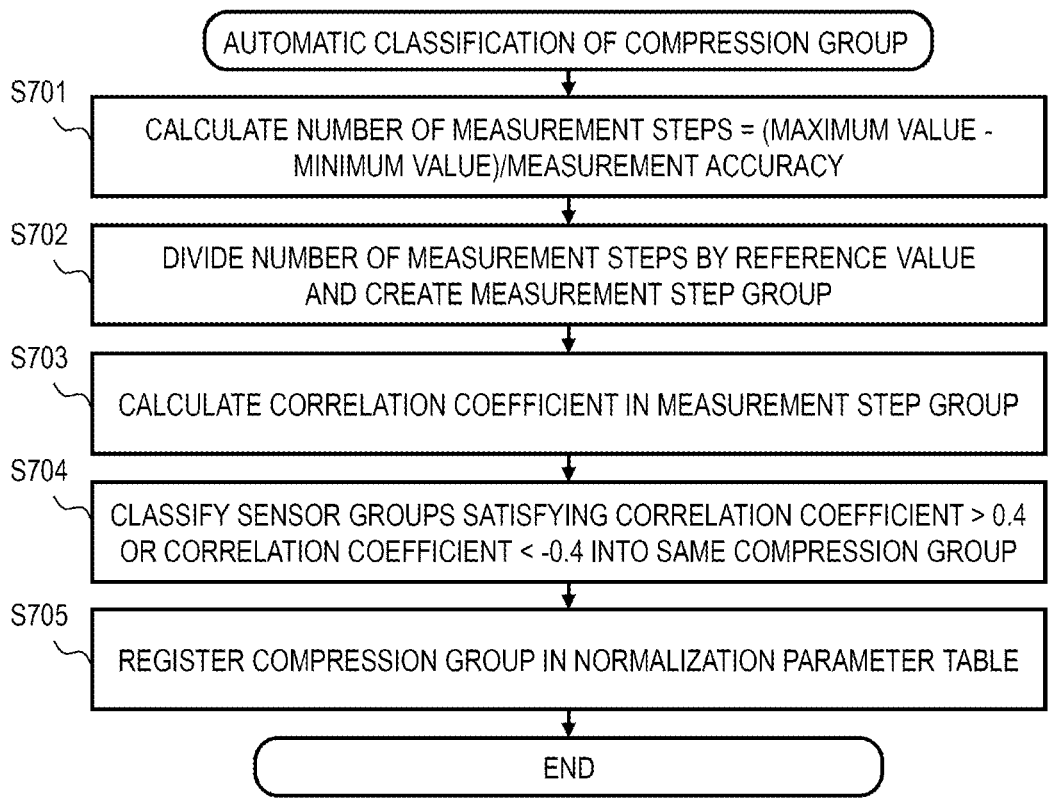
FIG. 7 is a flowchart illustrating an example according to an embodiment for a processor to classify a plurality of sensors into compression groups.
Figure 8:
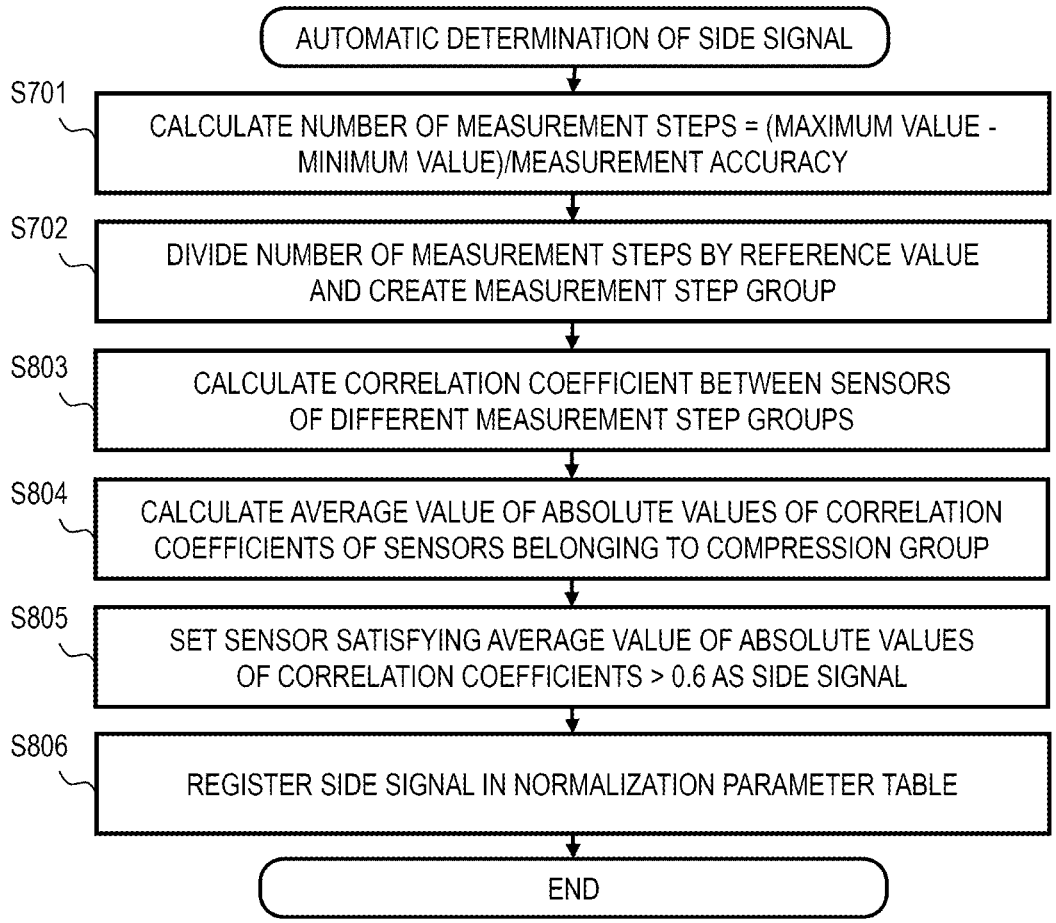
FIG. 8 is a flowchart illustrating an example according to the embodiment for determining a side signal.

The flowchart of FIG. 8 starts after the flowchart of FIG. 7 is completed or after the user manually sets the compression group. S701 and S702 are the same as those of FIG. 7.

The processor 112 calculates a correlation coefficient between sensors of different measurement step groups (S803). Next, based on the correlation coefficient calculated in S803, the processor 112 calculates an average value of absolute values of correlation coefficients between sensors of the compression group and sensors outside the compression group (S804).

For example, for a correlation coefficient between the sensor C belonging to a measurement step group different from a measurement step group to which the compression group 1 belongs, and the sensor A and the sensor B belonging to the compression group 1, the processor 112 calculates an average value of an absolute value of a correlation coefficient between the sensor C and the sensor A and an absolute value of a correlation coefficient between the sensor C and the sensor B. For the sensor D or the sensor E belonging to a measurement step group different from the measurement step group to which the compression group 1 belongs, similarly, an absolute value of a correlation coefficient between the sensor D or the sensor E and the sensor A and between the sensor D or the sensor E and the sensor B is calculated, and an average value thereof is calculated.

Next, the processor 112 determines whether or not the average value is greater than or equal to a threshold, for example, 0.6, and determines a positive sensor as a side signal for the compression group (S805). Next, the processor 112 registers a compression group name (group 1) in a sensor name determined as the side signal in the normalization parameter table 610 (S806).

According to the invention, parameters of each of a plurality of sensors are recorded in advance. When receiving sensor data, the processor reads parameters assigned to a sensor that outputs the sensor data, and can normalize the sensor data based on the parameters. Accordingly, it is not necessary to assign a buffer for recording a large amount of sensor data before compression from storage resources of a storage system, and thus it is possible to provide a storage system that can store various types of and large amounts of sensor data while accurately compressing the sensor data without wasting storage resources.

The above-described embodiment is an example of the invention and may be modified as appropriate. For example, a server may implement some or all of the normalization, compression, and decompression of sensor data. In addition, the flowchart (FIG. 7) for grouping sensors and the flowchart (FIG. 8) for determining side signals are examples and can be changed as appropriate. Further, the number of side signals for the compression of the sensor data is not limited to one and may be plural. Furthermore, the side signals may be set in a multilayer manner with respect to a plurality of sensors.

What is claimed is:

1. A storage system comprising:
a storage that records sensor data output from a plurality of sensors;
a processor that controls recording of sensor data in the storage; and
a memory that records parameters of the plurality of sensors, wherein the processor
groups the plurality of sensors based on parameters assigned to the sensors that output the sensor data and normalizes the sensor data for each group, wherein grouping the plurality of sensors comprises classifying the plurality of sensors into groups based on a value range of the sensor data and accuracy of the plurality of sensors, and registers the plurality of sensors in the parameters,
collectively compresses the normalized sensor data in the group, and
records the compressed sensor data in the storage.

2. The storage system according to claim 1, wherein the normalized sensor data is compressed by a neural network that learns the sensor data.

3. The storage system according to claim 2, wherein an encoder that compresses the sensor data is constituted by the neural network.

4. The storage system according to claim 1, wherein the processor normalizes the sensor data without using an abnormal value included in the sensor data.

5. The storage system according to claim 1, wherein the processor sets a compression method having a low compression rate to a group having a large value range per sensor accuracy.

6. The storage system according to claim 1, wherein the processor further classifies the sensors into groups based on correlation of the sensor data.

7. A storage system comprising:
a storage that records sensor data output from a plurality of sensors;
a processor that controls recording of sensor data in the storage; and
a memory that records parameters of the plurality of sensors, wherein the processor
groups the plurality of sensors based on parameters assigned to the sensors that output the sensor data and normalizes the sensor data for each group, determines sensors that are dependent on each other from the plurality of sensors based on the parameters read from the memory, normalizes and compresses sensor data of one sensor among the plurality of sensors that are dependent, and then normalizes and compresses sensor data of another sensor using the compressed data, the dependency is determined by correlation between the sensor data, collectively compresses the normalized sensor data in the group, and records the compressed sensor data in the storage.

8. The storage system according to claim 7, wherein the processor normalizes and lossy-compresses the sensor data of the one sensor, decompresses the lossy-compressed sensor data, and normalizes and compresses the sensor data of the other sensor using the decompressed sensor data.

9. A data recording method that records sensor data output from a plurality of sensors in a storage, wherein a processor that controls recording of sensor data in the storage groups the plurality of sensors based on parameters assigned to the sensors that output the sensor data and normalizes the sensor data for each group, wherein grouping the plurality of sensors comprises classifying the plurality of sensors into groups based on a value range of the sensor data and accuracy of the plurality of sensors, and registers the plurality of sensors in the parameters, collectively compresses the normalized sensor data in the group, and records the compressed sensor data in the storage.

10. A data recording method that records sensor data output from a plurality of sensors in a storage, wherein a processor that controls recording of sensor data in the storage groups the plurality of sensors based on parameters assigned to the sensors that output the sensor data and normalizes the sensor data for each group, determines sensors that are dependent on each other from the plurality of sensors based on the parameters read from the memory, normalizes and compresses sensor data of one sensor among the plurality of sensors that are dependent, and then normalizes and compresses sensor data of another sensor using the compressed data, the dependency is determined by correlation between the sensor data, collectively compresses the normalized sensor data in the group, and records the compressed sensor data in the storage.

* * * * *